(12) United States Patent
Awaya

(10) Patent No.: US 7,112,527 B2
(45) Date of Patent: Sep. 26, 2006

(54) MANUFACTURING METHOD FOR SHORT DISTANCE WIRING LAYERS AND LONG DISTANCE WIRING LAYERS IN A SEMICONDUCTOR DEVICE

(75) Inventor: Nobuyoshi Awaya, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 219 days.

(21) Appl. No.: 10/839,257

(22) Filed: May 6, 2004

(65) Prior Publication Data

US 2004/0209459 A1    Oct. 21, 2004

Related U.S. Application Data

(62) Division of application No. 09/986,051, filed on Nov. 7, 2001, now Pat. No. 6,891,261.

(30) Foreign Application Priority Data

Jun. 12, 2000    (JP) .............................. 2000-371625

(51) Int. Cl.
*H01L 21/4763* (2006.01)
(52) U.S. Cl. ..................... 438/622; 438/626; 438/627; 438/629; 438/637; 438/638
(58) Field of Classification Search ................ 438/622, 438/625–627, 629, 637, 638
See application file for complete search history.

(56) References Cited

U.S. PATENT DOCUMENTS

| | | | |
|---|---|---|---|
| 5,824,570 A | 10/1998 | Aoki et al. ................. 438/128 |
| 5,874,778 A * | 2/1999 | Bhattacharyya et al. ..... 257/758 |
| 5,952,709 A | 9/1999 | Kitazawa et al. ........... 257/664 |
| 6,225,207 B1 | 5/2001 | Parikh ......................... 438/622 |
| 6,242,796 B1 | 6/2001 | Sim et al. ................... 257/664 |
| 6,246,112 B1 | 6/2001 | Ball et al. ................... 257/690 |
| 6,303,422 B1 | 10/2001 | Abe et al. ................... 438/238 |
| 6,481,013 B1 | 11/2002 | Dinwiddie et al. ........... 725/80 |
| 6,720,245 B1 * | 4/2004 | Stucchi et al. .............. 438/614 |
| 2002/0030628 A1 | 3/2002 | Tsai ........................... 343/702 |
| 2002/0102835 A1* | 8/2002 | Stucchi et al. .............. 438/618 |
| 2003/0064577 A1* | 4/2003 | Hsu et al. ................... 438/619 |
| 2005/0245063 A1* | 11/2005 | Chinthakindi et al. ...... 438/618 |
| 2006/0097396 A1* | 5/2006 | Kamiyama et al. ......... 257/758 |

FOREIGN PATENT DOCUMENTS

| | | |
|---|---|---|
| JP | 06-084913 | 3/1994 |
| JP | 06-132288 | 5/1994 |
| JP | 08-316416 | 11/1996 |
| JP | 11-260930 | 9/1999 |

OTHER PUBLICATIONS

U.S. Appl. No. 09/986,051, filed Nov. 7, 2001.

* cited by examiner

*Primary Examiner*—Mary Wilczewski
*Assistant Examiner*—Toniae M. Thomas
(74) *Attorney, Agent, or Firm*—Nixon & Vanderhye P.C.

(57) ABSTRACT

A semiconductor device having regions for forming a plurality of functional blocks and a region for forming wiring layers for connecting the functional blocks, wherein each of the regions for forming the functional blocks includes a multilayer wiring, and the region for forming the wiring layers for connecting adjacent functional blocks includes a coaxial line comprised of a signal line and a ground line surrounding the signal line via an insulating film.

2 Claims, 10 Drawing Sheets

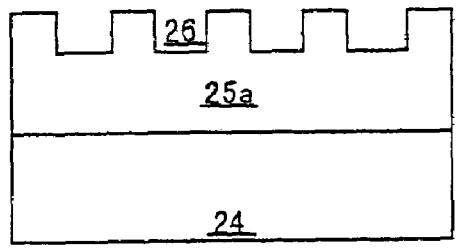
Fig.4(A-1)
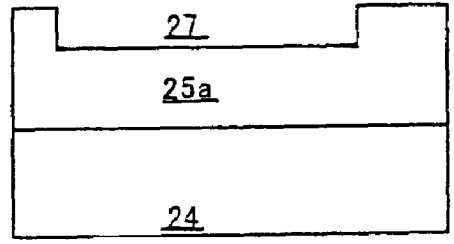
Fig.4(B-1)
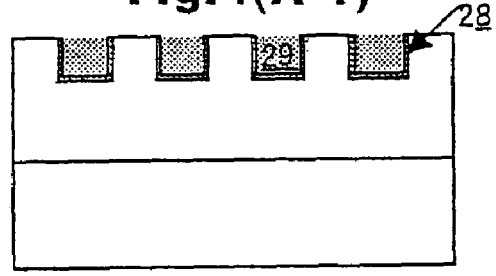
Fig.4(A-2)
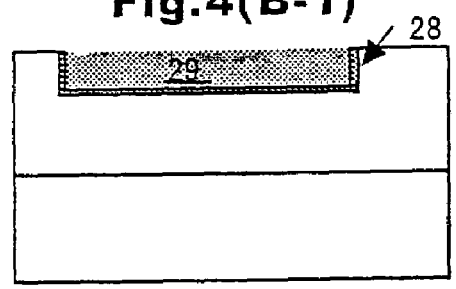
Fig.4(B-2)
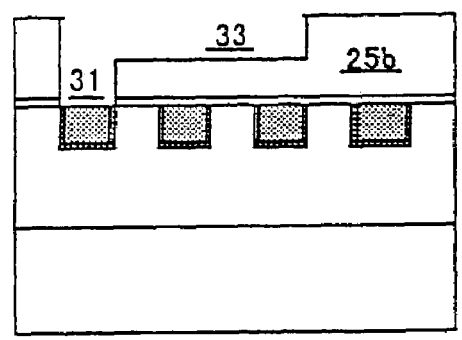
Fig.4(A-3)
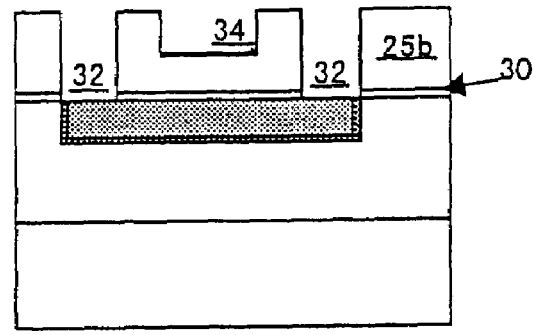
Fig.4(B-3)
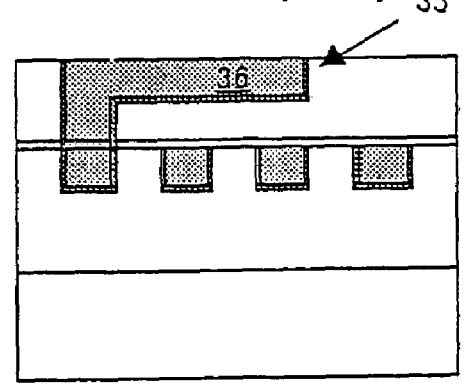
Fig.4(A-4)
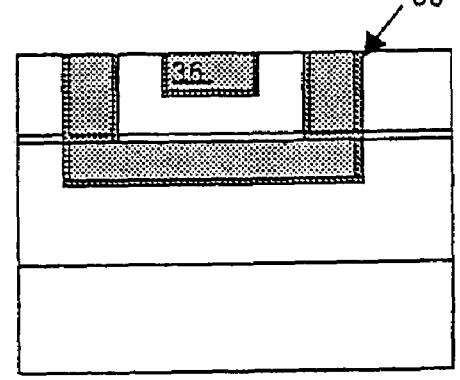
Fig.4(B-4)

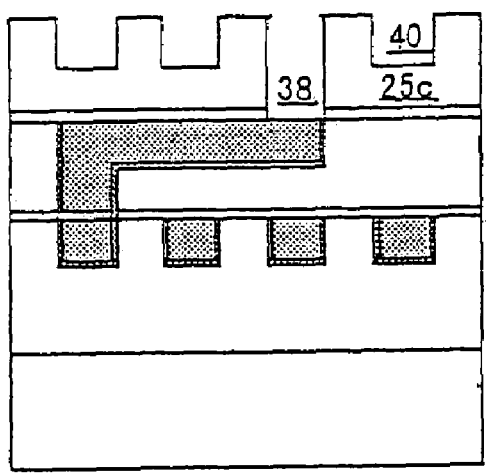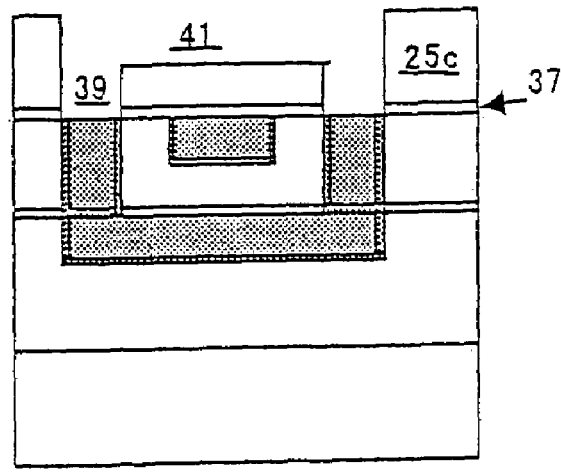
Fig.5(A-1)   Fig.5(B-1)
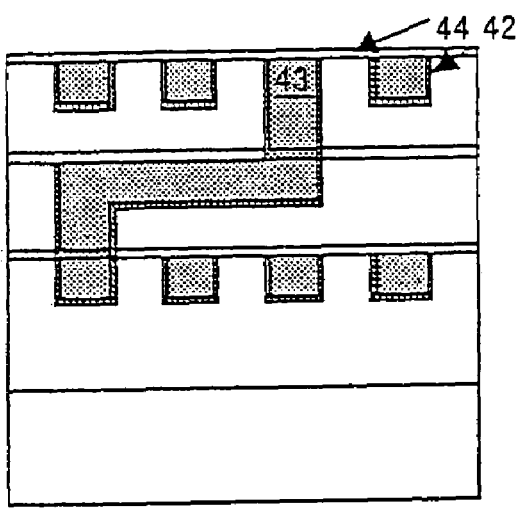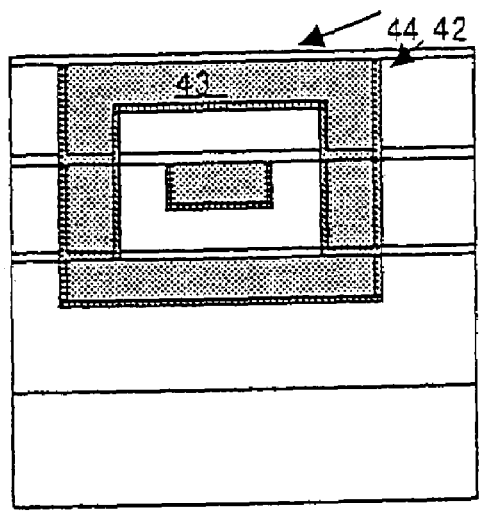
Fig.5(A-2)   Fig.5(B-2)

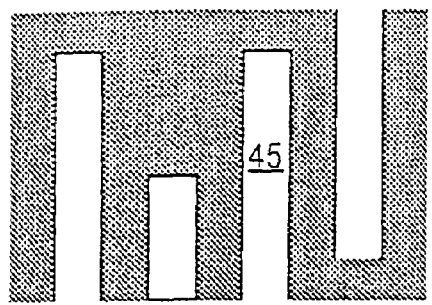
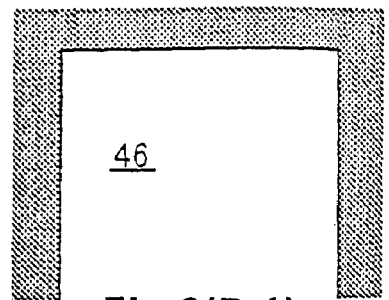
Fig.6(A-1)　　　　Fig.6(B-1)
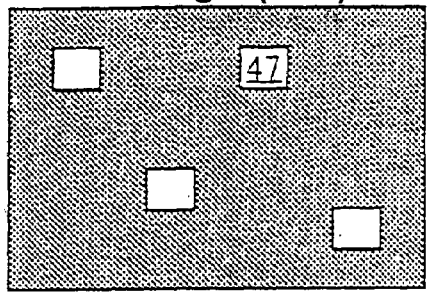
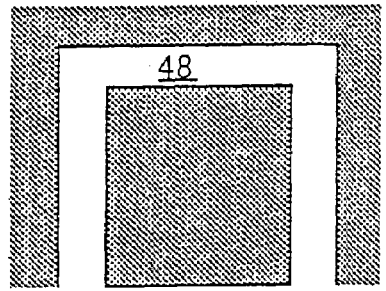
Fig.6(A-2)　　　　Fig.6(B-2)
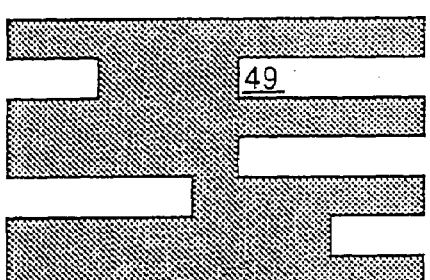
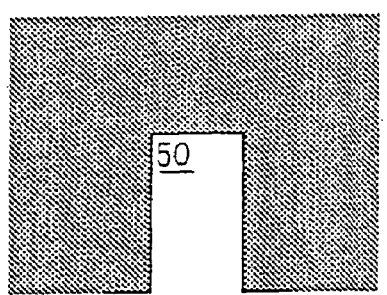
Fig.6(A-3)　　　　Fig.6(B-3)
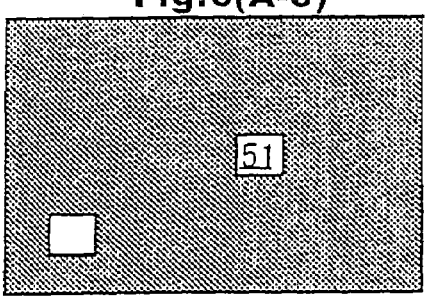
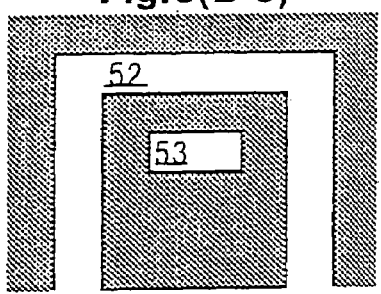
Fig.6(A-4)　　　　Fig.6(B-4)
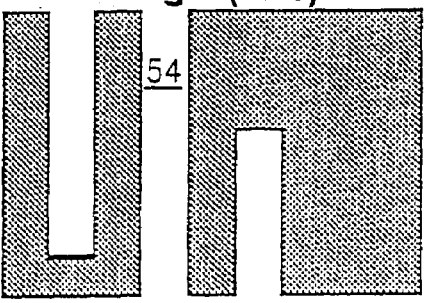
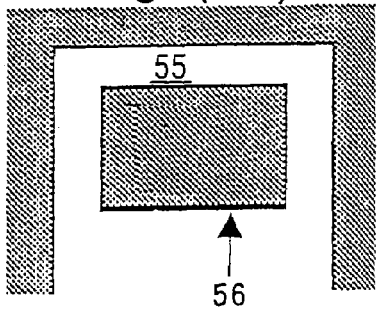
Fig.6(A-5)　　　　Fig.6(B-5)

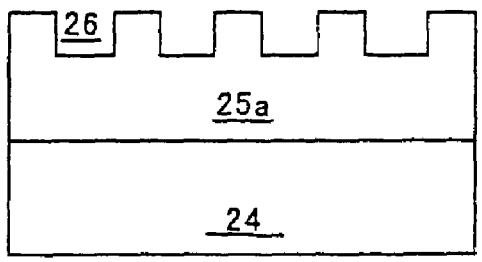
Fig.7(A-1)
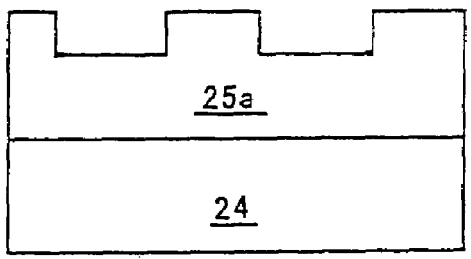
Fig.7(B-1)
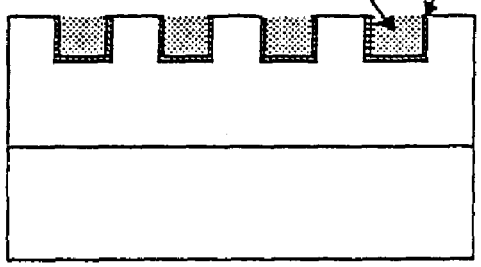
Fig.7(A-2)
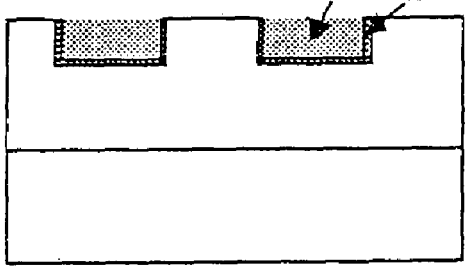
Fig.7(B-2)
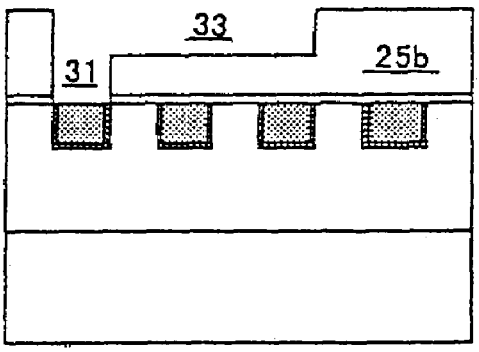
Fig.7(A-3)
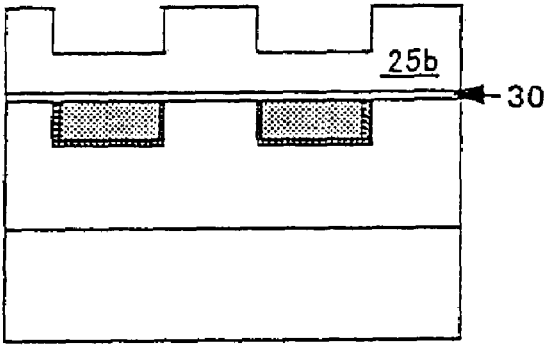
Fig.7(B-3)
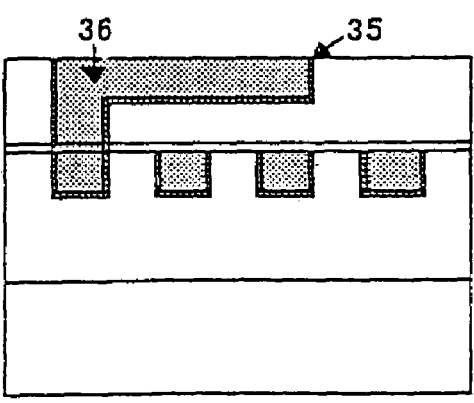
Fig.7(A-4)
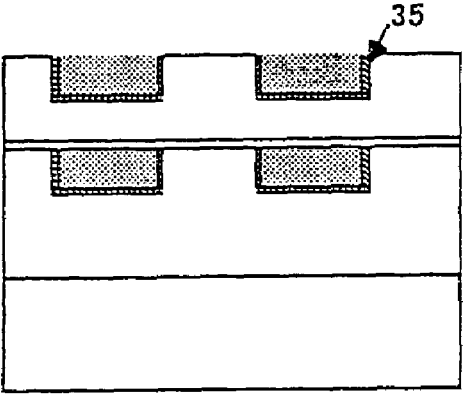
Fig.7(B-4)

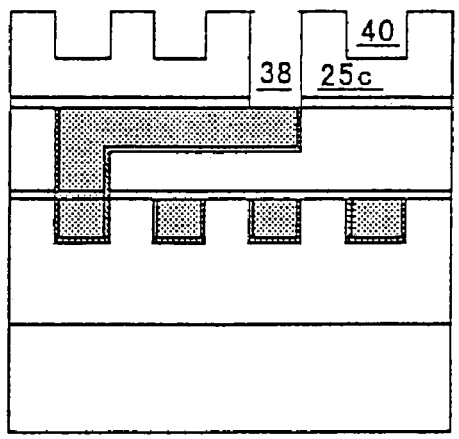
Fig.8(A-1)
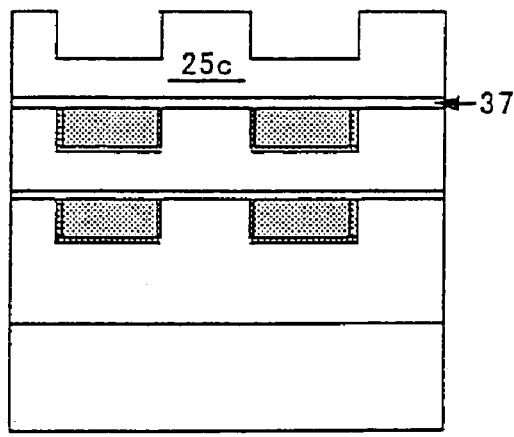
Fig.8(B-1)
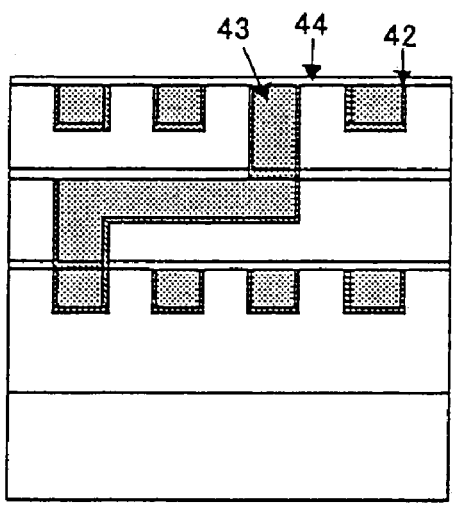
Fig.8(A-2)
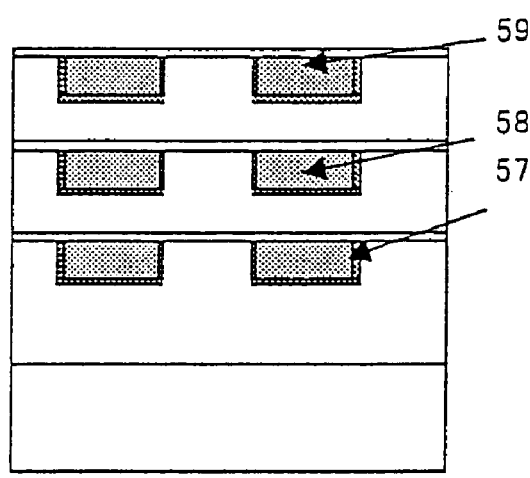
Fig.8(B-2)

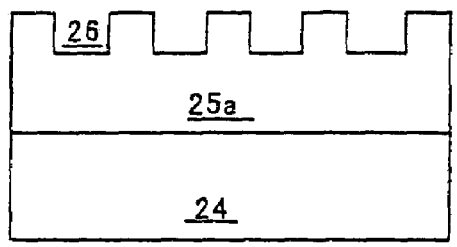
Fig.9(A-1)
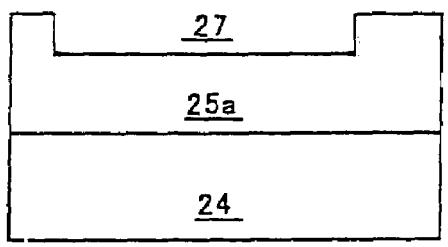
Fig.9(B-1)
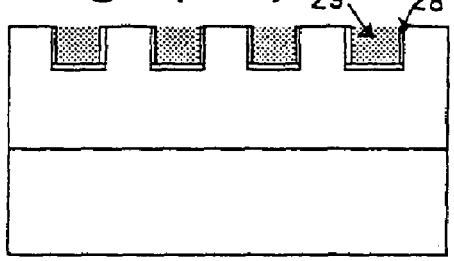
Fig.9(A-2)
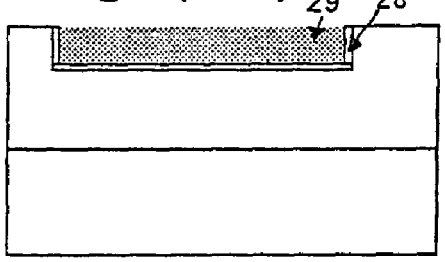
Fig.9(B-2)
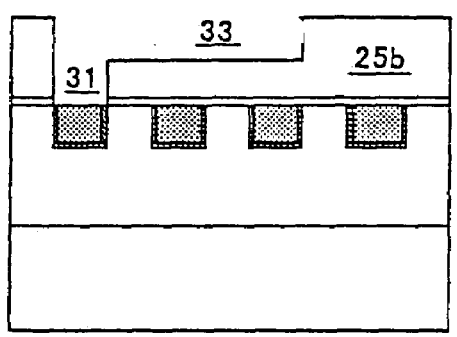
Fig.9(A-3)
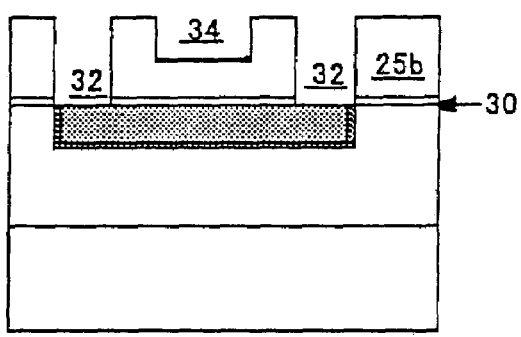
Fig.9(B-3)
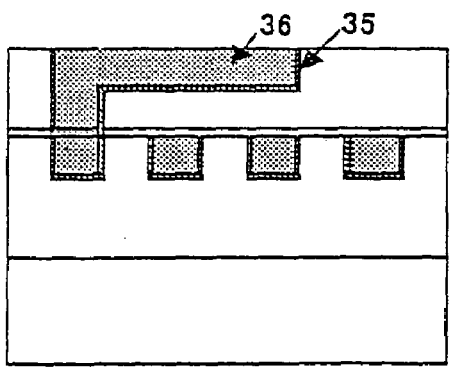
Fig.9(A-4)
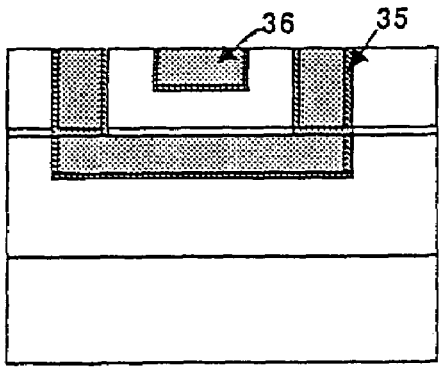
Fig.9(B-4)

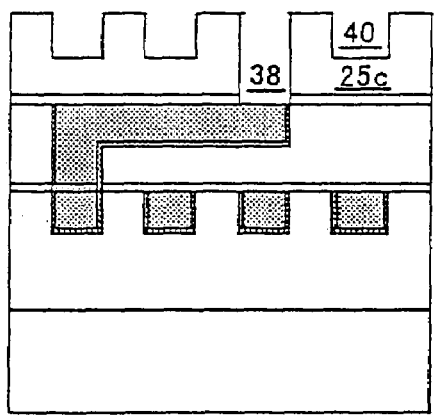
Fig.10(A-1)
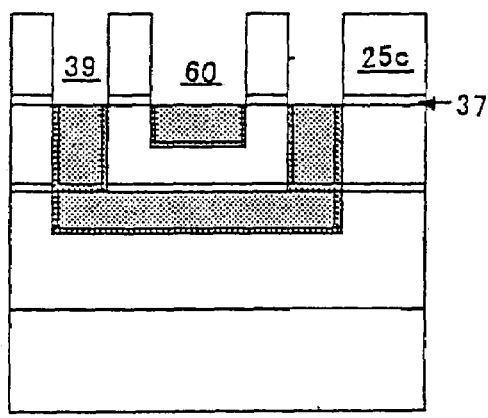
Fig.10(B-1)
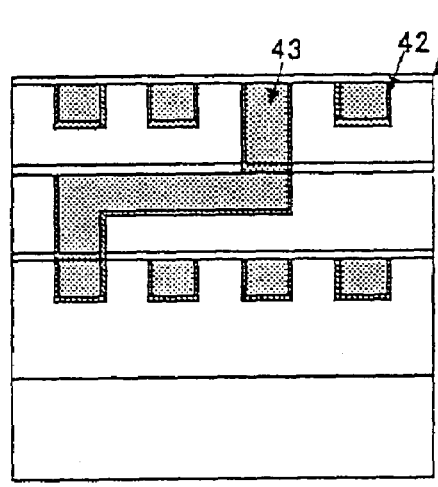
Fig.10(A-2)
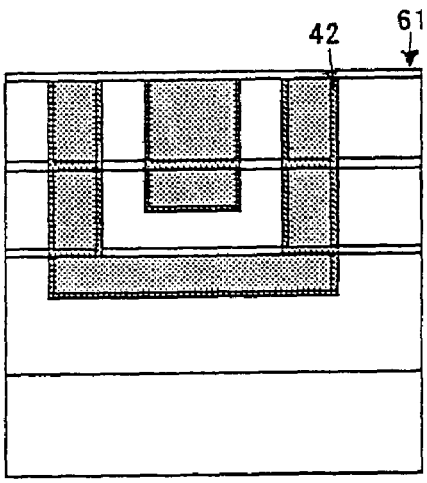
Fig.10(B-2)
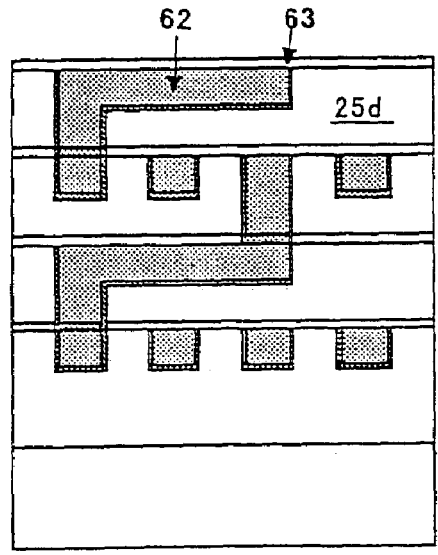
Fig.10(A-3)
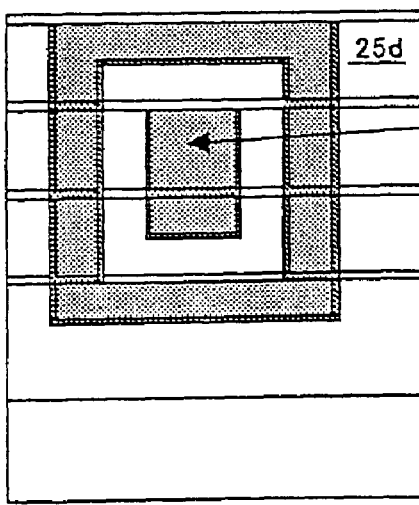
Fig.10(B-3)

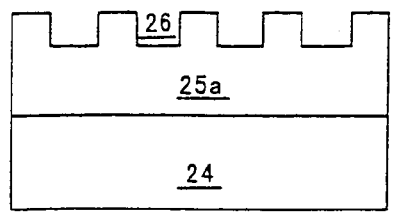
Fig.11(A-1)
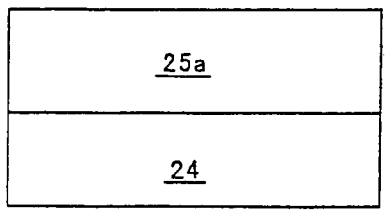
Fig.11(B-1)
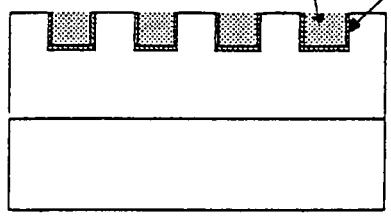
Fig.11(A-2)
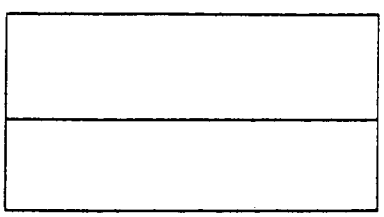
Fig.11(B-2)
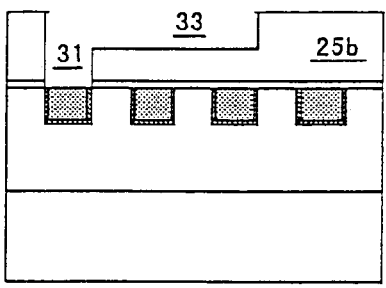
Fig.11(A-3)
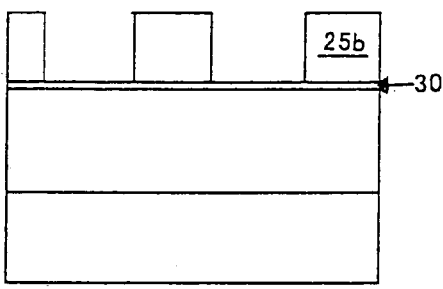
Fig.11(B-3)
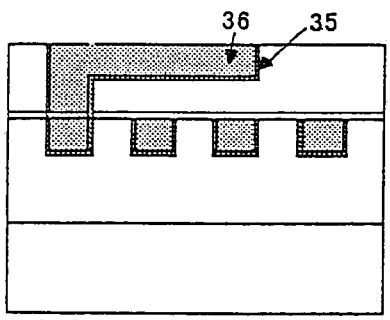
Fig.11(A-4)
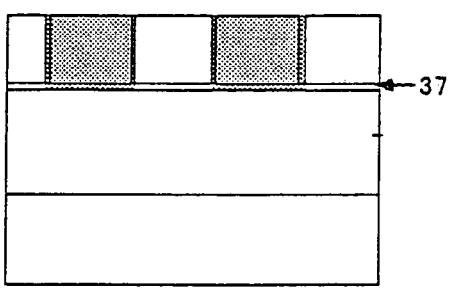
Fig.11(B-4)
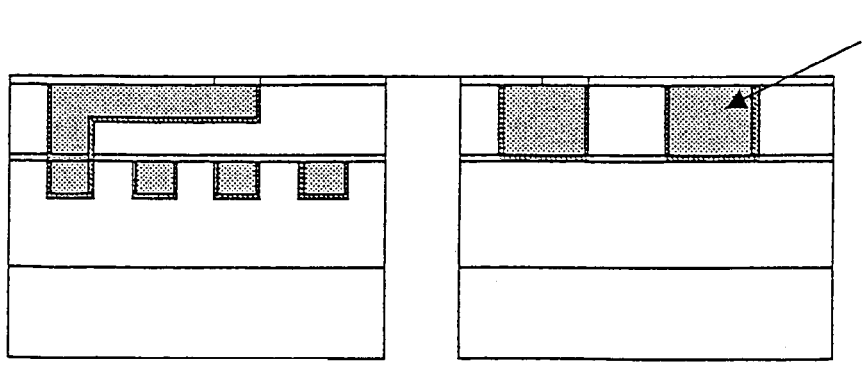
Fig.11(A-5)    Fig.11(B-5)

MANUFACTURING METHOD FOR SHORT DISTANCE WIRING LAYERS AND LONG DISTANCE WIRING LAYERS IN A SEMICONDUCTOR DEVICE

CROSS-REFERENCE TO RELATED APPLICATION

This application is a Divisional of application Ser. No. 09/986,051 filed Nov. 7, 2001, now U.S. Pat. No. 6,891,261, the entire content of which is hereby incorporated herein by reference in this application.

BACKGROUND OF THE INVENTION

1. Field of the Invention

The present invention relates to a semiconductor device and a method of manufacturing the same. In particular, it relates to a semiconductor device in which short-distance wiring layers in functional blocks and long-distance wiring layers for connecting the functional blocks are formed to have optimum structures suitable for their objects, respectively, without increasing the number of manufacturing steps and the number of wiring layers.

2. Description of Related Art

In accordance with progress in miniaturization, operation speed and integration of semiconductor devices (integrated semiconductor circuits), delay of signal transmission due to wiring layers increases. The signal transmission delay due to the wiring layers is determined by a product value of capacity and resistance of the wiring layers.

The capacity of the wiring layers is determined by a distance between the wiring layers, a thickness of the wiring layers and a dielectric constant of an insulating film between the wiring layers. The distance between the wiring layers can be enlarged by forming a multilayer wiring, which reduces the capacity. However, the formation of the multilayer wiring increases the number of manufacturing steps, raises production costs and thus decreases the yield. If the wiring layers are thinned, the capacity between the wiring layers can be reduced but resistance of the wiring layers increases. Further, since current density increases, a material for the wiring layers must be low resistive and highly electromigration-resistant. The wiring capacity can be further reduced by using a layer of low dielectric constant. Moreover, the resistance of the wiring layers can be reduced by forming thick wiring layers with a low resistive wiring material.

Considering the circumstances mentioned above, low resistive and electromigration-resistant copper and an insulating film of low dielectric constant have been used in the field of high performance semiconductor devices as shown in FIG. 1. Further, in a short-distance wiring layer lying in an undermost part of the multiplayer wiring, ON resistance of transistors connected in series is greater than the wiring resistance. Therefore, the short-distance wiring layer is formed thin in view of importance of the wiring capacity. On the other hand, a low resistive transistor having high driving capability is used in a long-distance wiring layer. Therefore, thick wiring layers are formed at a greater distance therebetween in view of importance of the wiring resistance.

FIG. 1 shows a semiconductor substrate 1 on which semiconductor elements have been formed, an interlayer insulating film 2, thin short-distance wiring layers 3, an interlayer insulating film 4 of low dielectric constant, middle-distance wiring layers 5 having a moderate thickness and thick long-distance wiring layers 6 used for connecting the functional blocks.

Even if the wiring structure is optimized as described above, it is getting difficult to transmit a signal of several GHz or more through the entire distance of a chip, especially in the long-distance wiring layer, because of limitation of the wiring resistance and the wiring capacity.

In order to transmit a signal of high frequency of several GHz or more through a chip size distance of about 1 cm, it is desired to eliminate RC delay by using a transmission line such as a microstrip line or a coaxial cable (coaxial line) and realizing impedance matching at the end. This may be achieved by forming a multilayer wiring by a conventional method and then forming a transmission line. However, this method inevitably increases the number of manufacturing steps to form the multilayer wiring and the transmission line.

SUMMARY OF THE INVENTION

In view of the above-described problems, the present invention has been achieved to form a normal wiring structure in the region for forming the functional blocks and at the same time, the transmission line or the coaxial line in the region for forming the wiring layers for connecting the functional blocks, without increasing the number of the manufacturing steps.

According to the first aspect of the present invention, provided is a semiconductor device comprising: regions for forming a plurality of functional blocks; and a region for forming wiring layers for connecting the functional blocks, wherein each of the regions for forming the functional blocks includes a multilayer wiring, and the region for forming the wiring layers for connecting adjacent functional blocks includes a coaxial line comprised of a signal line and a ground line surrounding the signal line via an insulating film.

According to the second aspect of the present invention, provided is a semiconductor device comprising: regions for forming a plurality of functional blocks; and a region for forming wiring layers for connecting the functional blocks, wherein each of the regions for forming the functional blocks includes a multilayer wiring, and the region for forming the wiring layers for connecting the functional blocks includes a transmission line comprised a signal line and ground lines or power source lines formed above and below the signal line, respectively to sandwich the signal line via an insulating film.

According to the third aspect of the present invention, provided is a semiconductor device comprising: regions for forming a plurality of functional blocks; and a region for forming wiring layers for connecting the functional blocks, wherein each of the regions for forming the functional blocks includes a multilayer wiring, and the region for forming the wiring layers for connecting the functional blocks includes wiring layers thicker than those in the functional blocks, and a bottom surface of any wiring in the multilayer wiring provided in the region for forming the functional block is on the same plane as a bottom surface of the wiring layer provided in the region for forming the wiring layers for connecting the functional blocks.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 4(A-1) to 4(B-4) are schematic sectional views for illustrating manufacturing steps of the semiconductor device according to the present invention;

FIGS. 5(A-1) to 5(B-2) are schematic sectional views for illustrating manufacturing steps of the semiconductor device according to the present invention;

FIGS. 6(A-1) to 6(B-5) are schematic sectional views for illustrating manufacturing steps of the semiconductor device according to the present invention;

FIGS. 7(A-1) to 7(B-4) are schematic sectional views for illustrating manufacturing steps of the semiconductor device according to the present invention;

FIGS. 8(A-1) to 8(B-2) are schematic sectional views for illustrating manufacturing steps of the semiconductor device according to the present invention;

FIGS. 9(A-1) to 9(B-4) are schematic sectional views for illustrating manufacturing steps of the semiconductor device according to the present invention;

FIGS. 10(A-1) to 10(B-3) are schematic sectional views for illustrating manufacturing steps of the semiconductor device according to the present invention; and FIGS. 11(A-1) to 11(B-5) are schematic sectional views for illustrating manufacturing steps of the semiconductor device according to the present invention.

DESCRIPTION OF THE PREFERRED EMBODIMENTS

Figure 1:
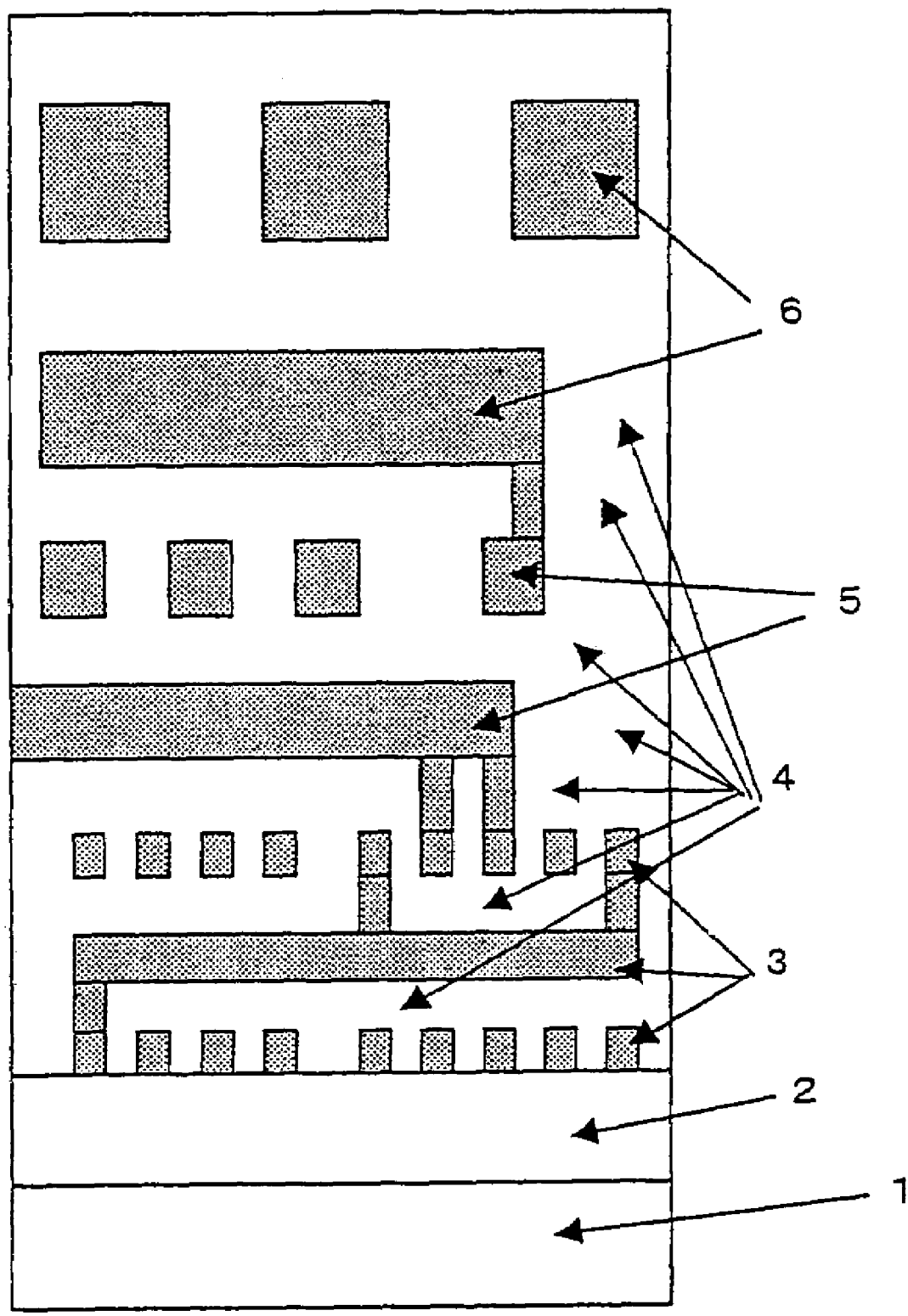
FIG. 1 is a schematic sectional view for illustrating a wiring structure of a conventional semiconductor device.

According to the present invention, the above-mentioned semiconductor devices are provided.

Also, the semiconductor device according to the first aspect of the present invention is formed by the following methods (1) and (2).

(1) A method of manufacturing a semiconductor device having regions for forming a plurality of functional blocks and a region for forming wiring layers for connecting the functional blocks, the method comprises the steps of: forming a groove corresponding to a first wiring layer in an underlying insulating film in the region for forming the functional block and at the same time, forming a groove corresponding to a lower part of a ground line which surrounds a single line to form a coaxial line in an underlying insulating film in the region for forming the wiring layers for connecting the functional blocks; forming a barrier metal layer in the grooves by Damascene process, forming a wiring material layer, and then subjecting the wiring material layer to chemical mechanical polishing so that the wiring material layer is left only in the grooves, thereby forming a first wiring layer and a lower part of the ground line; depositing a first insulating film capable of preventing diffusion of the wiring material, depositing a first interlayer insulating film, and then forming a hole for connecting the first wiring layer with a second wiring layer in the first interlayer insulating film in the region for forming the functional block and at the same time, forming grooves corresponding to side parts of the ground line in the first interlayer insulating film in the region for forming the wiring layers for connecting the functional blocks; forming a groove corresponding to a second wiring layer in the region for forming the functional block, and at the same time, forming a groove corresponding to a signal line in the region for forming the wiring layers for connecting the functional blocks; forming a barrier metal layer in the grooves by Damascene process, forming a wiring material layer, and then subjecting the wiring material layer to chemical mechanical polishing so that the wiring material layer is left only in the grooves, thereby forming a second wiring layer, side parts of the ground line and a signal line; depositing a second insulating film capable of preventing diffusion of the wiring material, depositing a second interlayer insulating film, and then forming a hole for connecting the second wiring layer with a third wiring layer in the second interlayer insulating film in the region for forming the functional block and at the same time, forming grooves corresponding to side parts of the ground line in the second interlayer insulating film in the region for forming the wiring layers for connecting the functional blocks; forming a groove corresponding to a third wiring layer in the second interlayer insulating film in the region for forming the functional block and at the same time, forming a groove corresponding to an upper part of the ground line in the second interlayer insulating film in the region for forming the wiring layers for connecting the functional blocks; forming a barrier metal layer in the grooves by Damascene process, forming a wiring material layer, and then subjecting the wiring material layer to chemical mechanical polishing so that the wiring material layer is left only in the grooves, thereby forming a third wiring layer and an upper part of the ground line; and depositing a third insulating film capable of preventing diffusion of the wiring material.

(2) A method of manufacturing a semiconductor device having regions for forming a plurality of functional blocks and a region for forming wiring layers for connecting the functional blocks, the method comprises the steps of: forming a groove corresponding to a first wiring layer in an underlying insulating film in the region for forming the functional block and at the same time, forming a groove corresponding to a lower part of a ground line which surrounds a single line to form a coaxial line in an underlying insulating film in the region for forming the wiring layers for connecting the functional blocks; forming a barrier metal layer in the grooves by Damascene process, forming a wiring material layer, and then subjecting the wiring material layer to chemical mechanical polishing so that the wiring material layer is left only in the grooves, thereby forming a first wiring layer and a lower part of the ground line; depositing a first insulating film capable of preventing diffusion of the wiring material, depositing a first interlayer insulating film, and then forming a hole for connecting the first wiring layer with a second wiring layer in the first interlayer insulating film in the region for forming the functional block and at the same time, forming grooves corresponding to side parts of the ground line in the first interlayer insulating film in the region for forming wiring layers for connecting the functional blocks; forming a groove corresponding to a second wiring layer in the first interlayer insulating film in the region for forming the functional block and at the same time, forming a groove corresponding to a signal line in the first interlayer insulating film in the region for forming the wiring layers for connecting the functional blocks; forming a barrier metal layer in the grooves by Damascene process, forming a wiring material layer, and then subjecting the wiring material layer to chemical mechanical polishing so that the wiring material layer is left only in the grooves, thereby forming a second wiring layer, side parts of the ground line and a signal line; depositing a second insulating film capable of preventing diffusion of the wiring material, depositing a second interlayer insulating film, and then forming a hole for connecting the second wiring layer with a third wiring layer in the second interlayer insulating film in the region for forming the functional block and at the same time, forming grooves corresponding to side parts of the ground line and a signal line in the second interlayer insulating film in the region for forming the wiring layers for connecting the functional blocks; forming a groove corresponding to a third wiring layer in the second interlayer insulating film in the region for forming the functional block and at the same time, forming grooves corresponding to side parts of the ground line and a signal line in the second interlayer insulating film in the region for forming the wiring layers for connecting the functional blocks; forming a barrier metal layer in the grooves by Damascene process, forming a wiring material layer, and then subjecting the wiring material layer to chemical mechanical polishing so that the wiring material layer is left only in the grooves, thereby forming a third wiring layer and a signal line; depositing a third insulating film capable of preventing diffusion of the wiring material, depositing a third interlayer insulating film, and then forming a hole for connecting the third wiring layer with a fourth wiring layer in the third interlayer insulating film in the region for forming the functional block and at the same time, forming grooves corresponding to side parts of the ground line in the third insulating film in the region for forming the wiring layers for connecting the functional blocks; forming a groove corresponding to a fourth wiring layer in the third interlayer insulating film in the region for forming the functional block and at the same time, forming a groove corresponding to an upper part of the ground line in the third interlayer insulating film in the region for forming the wiring layers for connecting the functional blocks; forming a barrier metal layer in the grooves by Damascene process, forming a wiring material layer, and then subjecting the wiring material layer to chemical mechanical polishing so that the wiring material layer is left only in the grooves, thereby forming a fourth wiring layer and an upper part of the ground line; and depositing a fourth insulating film capable of preventing diffusion of the wiring material.

The semiconductor device according to the second aspect of the present invention is formed by the following method.

A method of manufacturing a semiconductor device having regions for forming a plurality of functional blocks and a region for forming wiring layers for connecting the functional blocks, the method comprising the steps of: forming a groove corresponding to a first wiring layer in an underlying interlayer insulating film in the region for forming the functional block and at the same time, forming a groove corresponding to a lower ground line or power source line in an underlying interlayer insulating film in the region for forming the wiring layers for connecting the functional blocks; forming a barrier metal layer in the grooves by Damascene process, forming a wiring material layer, and then subjecting the wiring material layer to chemical mechanical polishing so that the wiring material layer is left only in the grooves, thereby forming a first wiring layer and the lower ground line or power source line; depositing a first insulating film capable of preventing diffusion of the wiring material, depositing a first interlayer insulating film, and then forming a hole for connecting the first wiring layer with a second wiring layer in the first interlayer insulating film in the region for forming the functional block; forming a groove corresponding to a second wiring layer in the region for forming the functional block and at the same time, forming a groove corresponding to a signal line in the region for forming the wiring layers for connecting the functional blocks; forming a barrier metal layer in the grooves by Damascene process, forming a wiring material layer, and then subjecting the wiring material layer to chemical mechanical polishing so that the wiring material layer is left only in the grooves, thereby forming a second wiring layer and a signal line; depositing a second insulating film capable of preventing diffusion of the wiring material, depositing a second interlayer insulating film, and then forming a hole for connecting the second wiring layer with a third wiring layer in the second interlayer insulating film in the region for forming the functional block; forming a groove corresponding to a third wiring layer in the region for forming the functional block and at the same time, forming a groove corresponding to an upper ground line or power source line in the region for forming the wiring layers for connecting the functional blocks; forming a barrier metal layer in the grooves by Damascene process, forming a wiring material layer, and then subjecting the wiring material layer to chemical mechanical polishing so that the wiring material layer is left only in the grooves, thereby forming a third wiring layer and an upper ground line or power source line; and depositing a third insulating film capable of preventing diffusion of the wiring material.

The semiconductor device according to the third aspect of the present invention is formed by the following method.

A method of manufacturing a semiconductor device having regions for forming a plurality of functional blocks and a region for forming wiring layers for connecting the functional blocks, the method comprising the steps of: forming a groove corresponding to a first wiring layer in an underlying insulating film in the region for forming the functional block; forming a barrier metal layer in the groove by Damascene process, forming a wiring material layer, and then subjecting the wiring material layer to chemical mechanical polishing so that the wiring material layer is left only in the grooves, thereby forming a first wiring layer; depositing a first insulating film capable of preventing diffusion of the wiring material, depositing a first interlayer insulating film, and then forming a hole for connecting the first wiring layer with a second wiring layer in the first interlayer insulating film in the region for forming the functional block and at the same time, forming a groove corresponding to a signal line in the first interlayer insulating film in the region for forming wiring layers for connecting the functional blocks; forming a groove corresponding to a second wiring layer in the first interlayer insulating film in the region for forming the functional block, forming a barrier metal layer in the grooves by Damascene process, forming a wiring material layer, and then subjecting the wiring material layer to chemical mechanical polishing so that the wiring material layer is left only in the grooves, thereby forming a second wiring layer and a signal line; and depositing a second insulating film capable of preventing diffusion of the wiring material.

Hereinafter, the present invention will be explained.

Figure 2:
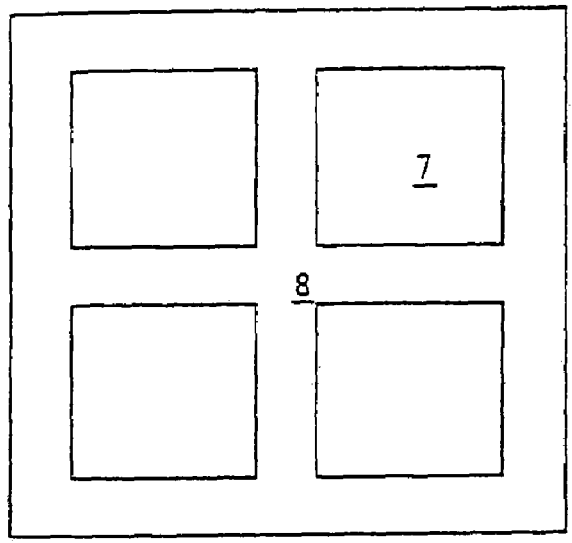
FIG. 2 is a schematic plan view for illustrating a semiconductor device according to the present invention.

A semiconductor device is comprised of a plurality of functional blocks as shown in a plan view of FIG. 2. FIG. 2 shows regions 7 for forming the functional blocks (hereinafter merely referred to as functional blocks) and a region 8 for forming wiring layers for connecting the functional blocks (hereinafter merely referred to as an interblock region). The wiring layers of the semiconductor device include short-distance wiring layers and middle-distance wiring layers for connecting semiconductor elements within the functional block 7 and long-distance wiring layers formed in the interblock region 8. A feature of the present invention is to provide the wiring layers in the functional block 7 and those in the interblock region 8 that are different in structure.

Figure 3:
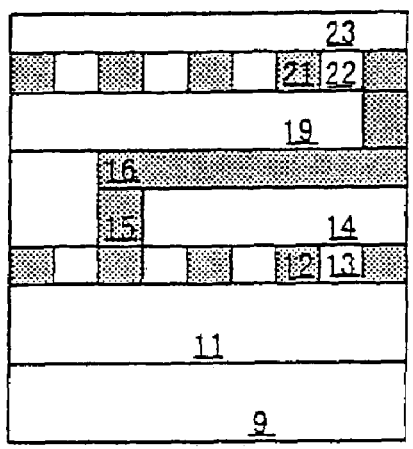
FIGS. 3(1) to 3(3) are schematic sectional views for illustrating the semiconductor device according to the present invention.
Figure 3:
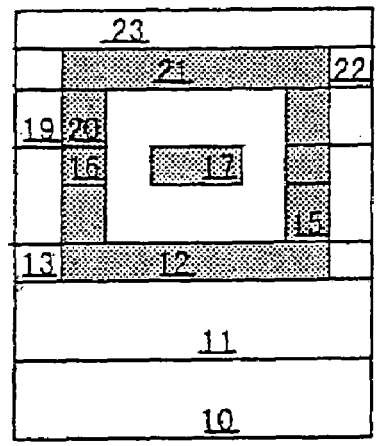
Figure 3:
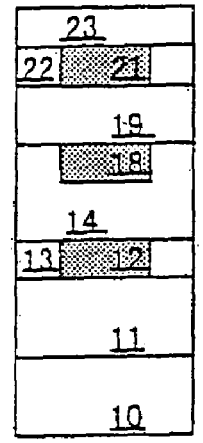

FIGS. 3(1) to 3(3) show the detail of the structure of the device according to the present invention.

The wiring layers in the functional block may be formed to have a conventional wiring structure as shown in FIG. 3(1). Accordingly, the existing design manner for the wiring layers in the functional block can be utilized directly.

In the interblock region, a metal layer (signal line) 17 may be surrounded by a ground layer comprised of metal layers 12, 15, 16, 20 and 21 so that a coaxial line is provided as shown in FIG. 3(2). Further, as shown in FIG. 3(3), a metal layer (signal line) 18 may be sandwiched between metal layers 12 and 21 formed below and above the metal layer 18, respectively. The metal layers 12 and 21 serve as ground lines or power source lines, and constitute a transmission line together with the signal line.

FIGS. 3(1) to 3(3) show a semiconductor substrate 9 in the functional block and a semiconductor substrate 10 in the interblock region. On the semiconductor substrate 9 in the functional block, semiconductor elements may be formed in desired positions. The metal layers 12, 15–18, 20 and 21 are formed of copper or the like. A barrier metal layer may be formed on the periphery of the metal layers. Further, reference numerals 11, 13, 14, 19, 22 and 23 denote an interlayer insulating film, respectively.

The above-mentioned wiring structure may be formed by a known Damascene process with an optimized patterning layout. For example, to form a coaxial line in the interblock region, a lower part of the ground line for surrounding the signal line (the metal layer 12 shown in FIG. 3(2)) is formed in the interblock region simultaneously with a step of forming a first wiring layer (the metal layer 12 in FIG. 3(1)) in the functional block. Then, the signal line and side parts of the ground line for surrounding the signal line (the metal layers 15–17 shown in FIG. 3(2)) are formed in the interblock region simultaneously with a step of forming a via contact for connecting the first wiring layer with a second wiring layer and forming the second wiring layer (the metal layers 15 and 16 shown in FIG. 3(1)) in the functional block. Further, side parts and an upper part of the ground line for surrounding the signal line (the metal layers 20 and 21 shown in FIG. 3(2)) are formed in the interblock region simultaneously with a step of forming a via contact for connecting the second wiring layer with a third wiring layer and forming the third wiring layer (the metal layers 20 and 21 shown in FIG. 3(1)) in the functional block. In the case of providing a multilayer wiring, a second coaxial line can be formed in the same manner as described above. Inductors and capacitors may further be formed in the same manner as the above, if required.

EXAMPLES

Hereinafter, the present invention will be explained by way of examples with reference to the figures.

Example 1

Referring to FIGS. 4(A-1) to 4(B-4) and FIGS. 5(A-1) to (B-2), Example 1 will be described. FIGS. 4(A-1) to 4(A-4) and FIGS. 5(A-1) to 5(A-2) show sectional views for illustrating steps of forming normal wiring layers in a functional block (corresponding to a functional block 7 of FIG. 2). FIGS. 4(B-1) to 4(B-4) and FIGS. 5(B-1) to 5(B-2) show sectional views for illustrating steps of forming long-distance wiring layers in an interblock region (corresponding to an interblock region 8 of FIG. 2).

Referring to FIGS. 4(A-1) and 4(B-1), in the functional block, a groove 26 corresponding to a first wiring layer is formed on an interlayer insulating film 25a lying over a semiconductor substrate 24 on which transistors have been formed. In the interblock region, a groove 27 corresponding to a lower part of a ground line surrounding a signal line so as to provide a coaxial line is formed simultaneously with the step of forming the groove 26 in the functional block. A depth of the grooves may be 3000–5000 Å, but it is not particularly limited because it is predicted that the depth will be smaller in accordance with future progress in miniaturization of the device.

In FIGS. 4(A-2) and 4(B-2), a barrier metal layer 28 made of Ta, TaN, TiN or the like is formed in the grooves 26 and 27 to have a thickness of about 100–500 Å by known Damascene process. Then a copper film (wiring material layer) is formed on the entire surface by known electrolysis plating or CVD and subjected to chemical mechanical polishing (CMP) to leave the copper film 29 only in the grooves. Thus, the first wiring layers and the lower part of the ground line are formed in the functional block and the interblock region, respectively. This step can be carried out by a known method.

FIGS. 4(A-3) and 4(B-3) show that a first insulating film 30 made of silicon nitride capable of preventing diffusion of copper is deposited to a thickness of 100–500 Å and then a first interlayer insulating film 25b of 6000–15000 Å is deposited thereon, in which a connection hole 31 and grooves 32 are formed by known dual Damascene process. The interlayer insulating film may be a $SiO_2$ film or any other layer having low dielectric constant. If the layer of low dielectric constant is employed, the interlayer insulating film may be a multi-layered film rather than a single-layered film. Technique for etching the interlayer insulating film varies depending on the kind of material, but this is not important in the present invention.

Explanation is given to the case where a $SiO_2$ film is used as the first interlayer insulating film 25b. In the above-mentioned step, the connection hole 31 for connecting the first and second wiring layers is formed in the functional block and the grooves 32 corresponding to side parts of the ground line are formed in the interblock region. Successively, a groove 33 corresponding to a second wiring layer is formed in the functional block and at the same time, a groove 34 corresponding to a signal line is formed in the interblock region. A depth of the grooves may be 3000–5000 Å, but this is not particularly limited as described above.

FIGS. 4(A-4) and 4(B-4) show that the second wiring layer comprising a barrier metal layer 35 and a copper film 36 are formed in the functional block, and the side parts of the ground line and the signal line are formed in the interblock region by known Damascene process and CVD.

In FIGS. 5(A-1) and 5(B-1), a second insulating film 37 of silicon nitride capable of preventing diffusion of copper is deposited to a thickness of 100–500 Å and then a second interlayer insulating film 25c of 6000–15000 Å is deposited, in which a connection hole 38 and grooves 39–41 are formed by known Damascene process. Specifically, the connection hole 38 is formed in the functional block and at the same time, the grooves 39 corresponding to side parts of the ground line are formed in the interblock region. Then, the groove 40 corresponding to a third wiring layer is formed in the functional block and at the same time, the groove 41 corresponding to an upper part of the ground line is formed in the interblock region.

FIGS. 5(A-2) and 5(B-2) show that the third wiring layer and the upper part of the ground line, comprising a barrier metal layer 42 and a copper film 43, are formed by known Damascene process and CMP and then a third insulating film 44 of silicon nitride capable of preventing diffusion of copper is deposited to a thickness of 100–500 Å.

As described above, three-layered wiring is provided in the functional block and a coaxial line is formed in the interblock region. A second coaxial line can be formed by repeating the above-described steps.

FIGS. 6(A-1) to 6(B-5) show masks used for forming the wiring layers according to Example 1. FIGS. 6(A-1) to 6(A-5) show masks used for patterning the functional block and FIGS. 6(B-1) to 6(B-5) show masks used for patterning the interblock region.

Openings 45 and 46 shown in FIGS. 6(A-1) and 6(B-1) correspond to the groove 26 for forming the first wiring layer shown in FIG. 4(A-1) and the groove 27 for forming the lower part of the ground line shown in FIG. 4(B-1), respectively. Openings 47 and 48 shown in FIGS. 6(A-2) and 6(B-2) correspond to the connection hole 31 shown in FIG. 4(A-3) and the grooves 32 for forming the side parts of the ground line shown in FIG. 4(B-3), respectively.

Openings 49 and 50 shown in FIGS. 6(A-3) and 6(B-3) correspond to the groove 33 for forming the second wiring layer shown in FIG. 4(A-3) and the groove 34 for forming the signal line shown in FIG. 4(B-3), respectively.

Openings 51 and 52 shown in FIGS. 6(A-4) and 6(B-4) correspond to the connection hole 38 shown in FIG. 4(A-5) and the grooves 39 for forming the side parts of the ground line shown in FIG. 4(B-5), respectively. Further, FIG. 6(B-4) shows an opening 53 for providing an external connection hole for connecting the signal line with the upper part of the ground line.

Openings 54 and 55 shown in FIGS. 6(A-5) and 6(B-5) correspond to the groove 40 for forming the third wiring layer shown in FIG. 5(A-1) and the groove 41 for forming the upper part of the ground line shown in FIG. 5(B-1). Further, a mask 56 for connecting the signal line with the upper part of the ground line is provided.

Example 2

FIGS. 7(A-1) to 7(B-4) and FIGS. 8(A-1) to 8(B-2) are schematic sectional views for illustrating manufacturing steps of a semiconductor device according to Example 2. The semiconductor device of Example 2 is formed in the same manner as in Example 1 except that a transmission line is provided in the interblock region by sandwiching a signal line 58 between copper films 57 and 59 to be served as ground lines or power source lines formed below and above the signal line, respectively. Two transmission lines are formed in the figures.

Example 3

FIGS. 9(A-1) to 9(B-4) and FIGS. 10(A-1) to 10(B-3) are schematic sectional views for illustrating manufacturing steps of a semiconductor device according to Example 3. The semiconductor device of Example 3 is formed in the same manner as in Example 1 except that a connection hole for connecting the second wiring layer with a third wiring layer and the third wiring layer are further formed in the functional block, a thick signal line is formed during the formation of the connection hole and the third wiring layer and a coaxial line is completed when a fourth wiring layer is formed in the functional block, in order to further reduce resistance of the signal line. FIGS. 9 and 10 show a third interlayer insulating film 25d, a groove 60 corresponding to the signal line, a third insulating film 61, a copper film 62 serves as the fourth wiring layer and an upper part of the ground line, a fourth insulating film 63 and a copper film 64 serves as the signal line.

Example 4

FIGS. 11(A-1) to 11(B-5) show a simplified version of Example 1. That is, a semiconductor device is formed in the same manner as in Example 1 except that a thick wiring layer 65 is formed in the interblock region during a step of forming a connection hole for connecting first and second wiring layers and forming the second wiring layer in the function block.

According to the method of manufacturing the semiconductor device of the present invention, the wiring layers in the functional block and those in the interblock region that are different in structure are formed simultaneously, and a semiconductor device including long-distance wiring layers capable of transmitting high frequency signals at high speed is obtained without increasing the number of the manufacturing steps.

The invention claimed is:

1. A method of manufacturing a semiconductor device having regions for forming a plurality of functional blocks and a region for forming wiring layers for connecting the functional blocks, the method comprising the steps of:

forming a groove corresponding to a first wiring layer in an underlying insulating film in the region for forming the functional block and at the same time, forming a groove corresponding to a lower part of a ground line which surrounds a single line to form a coaxial line in an underlying insulating film in the region for forming the wiring layers for connecting the functional blocks;

forming a barrier metal layer in the grooves by Damascene process, forming a wiring material layer, and then subjecting the wiring material layer to chemical mechanical polishing so that the wiring material layer is left only in the grooves, thereby forming a first wiring layer and a lower part of the ground line;

depositing a first insulating film capable of preventing diffusion of the wiring material, depositing a first interlayer insulating film, and then forming a hole for connecting the first wiring layer with a second wiring layer in the first interlayer insulating film in the region for forming the functional block and at the same time, forming grooves corresponding to side parts of the ground line in the first interlayer insulating film in the region for forming the wiring layers for connecting the functional blocks;

forming a groove corresponding to a second wiring layer in the region for forming the functional block, and at the same time, forming a groove corresponding to a signal line in the region for forming the wiring layers for connecting the functional blocks;

forming a barrier metal layer in the grooves by Damascene process, forming a wiring material layer, and then subjecting the wiring material layer to chemical mechanical polishing so that the wiring material layer is left only in the grooves, thereby forming a second wiring layer, side parts of the ground line and a signal line;

depositing a second insulating film capable of preventing diffusion of the wiring material, depositing a second interlayer insulating film, and then forming a hole for connecting the second wiring layer with a third wiring layer in the second interlayer insulating film in the region for forming the functional block and at the same time, forming grooves corresponding to side parts of the ground line in the second interlayer insulating film in the region for forming the wiring layers for connecting the functional blocks;

forming a groove corresponding to a third wiring layer in the second interlayer insulating film in the region for forming the functional block and at the same time, forming a groove corresponding to an upper part of the ground line in the second interlayer insulating film in the region for forming the wiring layers for connecting the functional blocks;

forming a barrier metal layer in the grooves by Damascene process, forming a wiring material layer, and then subjecting the wiring material layer to chemical mechanical polishing so that the wiring material layer is left only in the grooves, thereby forming a third wiring layer and an upper part of the ground line; and depositing a third insulating film capable of preventing diffusion of the wiring material.

2. A method of manufacturing a semiconductor device having regions for forming a plurality of functional blocks and a region for forming wiring layers for connecting the functional blocks, the method comprising the steps of:

forming a groove corresponding to a first wiring layer in an underlying insulating film in the region for forming the functional block and at the same time, forming a groove corresponding to a lower part of a ground line which surrounds a single line to form a coaxial line in an underlying insulating film in the region for forming the wiring layers for connecting the functional blocks;

forming a barrier metal layer in the grooves by Damascene process, forming a wiring material layer, and then subjecting the wiring material layer to chemical mechanical polishing so that the wiring material layer is left only in the grooves, thereby forming a first wiring layer and a lower part of the ground line;

depositing a first insulating film capable of preventing diffusion of the wiring material, depositing a first interlayer insulating film, and then forming a hole for connecting the first wiring layer with a second wiring layer in the first interlayer insulating film in the region for forming the functional block and at the same time, forming grooves corresponding to side parts of the ground line in the first interlayer insulating film in the region for forming wiring layers for connecting the functional blocks;

forming a groove corresponding to a second wiring layer in the first interlayer insulating film in the region for forming the functional block and at the same time, forming a groove corresponding to a signal line in the first interlayer insulating film in the region for forming the wiring layers for connecting the functional blocks;

forming a barrier metal layer in the grooves by Damascene process, forming a wiring material layer, and then subjecting the wiring material layer to chemical mechanical polishing so that the wiring material layer is left only in the grooves, thereby forming a second wiring layer, side parts of the ground line and a signal line;

depositing a second insulating film capable of preventing diffusion of the wiring material, depositing a second interlayer insulating film, and then forming a hole for connecting the second wiring layer with a third wiring layer in the second interlayer insulating film in the region for forming the functional block and at the same time, forming grooves corresponding to side parts of the ground line and a signal line in the second interlayer insulating film in the region for forming the wiring layers for connecting the functional blocks;

forming a groove corresponding to a third wiring layer in the second interlayer insulating film in the region for forming the functional block and at the same time, forming grooves corresponding to side parts of the ground line and a signal line in the second interlayer insulating film in the region for forming the wiring layers for connecting the functional blocks;

forming a barrier metal layer in the grooves by Damascene process, forming a wiring material layer, and then subjecting the wiring material layer to chemical mechanical polishing so that the wiring material layer is left only in the grooves, thereby forming a third wiring layer and a signal line;

depositing a third insulating film capable of preventing diffusion of the wiring material, depositing a third interlayer insulating film, and then forming a hole for connecting the third wiring layer with a fourth wiring layer in the third interlayer insulating film in the region for forming the functional block and at the same time, forming grooves corresponding to side parts of the ground line in the third insulating film in the region for forming the wiring layers for connecting the functional blocks;

forming a groove corresponding to a fourth wiring layer in the third interlayer insulating film in the region for forming the functional block and at the same time, forming a groove corresponding to an upper part of the ground line in the third interlayer insulating film in the region for forming the wiring layers for connecting the functional blocks;

forming a barrier metal layer in the grooves by Damascene process, forming a wiring material layer, and then subjecting the wiring material layer to chemical mechanical polishing so that the wiring material layer is left only in the grooves, thereby forming a fourth wiring layer and an upper part of the ground line; and depositing a fourth insulating film capable of preventing diffusion of the wiring material.

* * * * *